(12) United States Patent
Takata

(10) Patent No.: US 12,199,591 B2
(45) Date of Patent: Jan. 14, 2025

(54) FILTER DEVICE, MULTIPLEXER, RADIO FREQUENCY FRONT-END CIRCUIT, AND COMMUNICATION DEVICE

(71) Applicant: Murata Manufacturing Co., Ltd., Nagaokakyo (JP)

(72) Inventor: Toshiaki Takata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 371 days.

(21) Appl. No.: 17/863,450

(22) Filed: Jul. 13, 2022

(65) Prior Publication Data

US 2022/0352875 A1    Nov. 3, 2022

Related U.S. Application Data

(63) Continuation of application No. PCT/JP2020/042038, filed on Nov. 11, 2020.

(30) Foreign Application Priority Data

Jan. 20, 2020  (JP) ................................. 2020-006851

(51) Int. Cl.
  *H03H 7/075*  (2006.01)
  *H03H 9/145*  (2006.01)
  (Continued)

(52) U.S. Cl.
  CPC ............ *H03H 9/725* (2013.01); *H03H 9/145* (2013.01); *H03H 9/25* (2013.01); *H03H 9/6483* (2013.01); *H04B 1/40* (2013.01); *H03H 9/02559* (2013.01)

(58) Field of Classification Search
  CPC .......... H03H 7/075; H03H 9/145; H03H 9/25; H03H 9/72; H03H 9/205; H03H 7/01; H03H 7/12
  See application file for complete search history.

(56) References Cited

U.S. PATENT DOCUMENTS

| 2012/0182088 A1 | 7/2012 | Inoue et al. |
| 2017/0099043 A1 | 4/2017 | Goto et al. |

(Continued)

FOREIGN PATENT DOCUMENTS

| JP | 2012151697 A | 8/2012 |
| JP | 2017092945 A | 5/2017 |

(Continued)

OTHER PUBLICATIONS

International Search Report in PCT/JP2020/042038, mailed Jan. 12, 2021, 4 pages.

(Continued)

*Primary Examiner* — Tu X Nguyen
(74) *Attorney, Agent, or Firm* — Keating & Bennett, LLP

(57) ABSTRACT

A filter device includes a filter circuit including first and second terminals and series arm resonators along a series arm connecting the first terminal and the second terminal, and an additional circuit connected in parallel at least some of the series arm resonators. The additional circuit includes first, second, and third interdigital transducer electrodes. The first interdigital transducer electrode is connected to a first node at one end portion of a series arm resonator having a lowest anti-resonant frequency of the series arm resonators, the second interdigital transducer electrode is connected to a second node having a potential different from a potential of the first node, the third interdigital transducer electrode is connected to a third node having a potential different from the potentials of the first and second nodes, and the first and second nodes are closer to the first terminal than the third node.

20 Claims, 4 Drawing Sheets

(51) Int. Cl.
    *H03H 9/25*     (2006.01)
    *H03H 9/64*     (2006.01)
    *H03H 9/72*     (2006.01)
    *H04B 1/40*     (2015.01)
    *H03H 9/02*     (2006.01)

(56)     References Cited

U.S. PATENT DOCUMENTS

| | | |
|---|---|---|
| 2018/0069529 A1 | 3/2018 | Bi et al. |
| 2018/0131344 A1* | 5/2018 | Komatsu .............. H03H 9/0014 |
| 2018/0131349 A1 | 5/2018 | Takata |
| 2019/0131954 A1 | 5/2019 | Okada |
| 2019/0245514 A1 | 8/2019 | Takata |
| 2019/0296716 A1 | 9/2019 | Araki |

FOREIGN PATENT DOCUMENTS

| | | |
|---|---|---|
| JP | 2018038040 A | 3/2018 |
| JP | 2018074539 A | 5/2018 |
| JP | 2019169921 A | 10/2019 |
| WO | 2018003338 A1 | 1/2018 |
| WO | 2018079284 A1 | 5/2018 |

OTHER PUBLICATIONS

Written Opinion in PCT/JP2020/042038, mailed Jan. 12, 2021, 5 pages.

* cited by examiner

FILTER DEVICE, MULTIPLEXER, RADIO FREQUENCY FRONT-END CIRCUIT, AND COMMUNICATION DEVICE

CROSS REFERENCE TO RELATED APPLICATIONS

This application claims the benefit of priority to Japanese Patent Application No. 2020-006851 filed on Jan. 20, 2020 and is a Continuation Application of PCT Application No. PCT/JP2020/042038 filed on Nov. 11, 2020. The entire contents of each application are hereby incorporated herein by reference.

BACKGROUND OF THE INVENTION

1. Field of the Invention

The present invention relates to a filter device, a multiplexer, a radio frequency front-end circuit, and a communication device, each including a plurality of series arm resonators.

2. Description of the Related Art

In general, various types of band pass filters each including a plurality of series arm resonators have been proposed. In a duplexer described in Japanese Unexamined Patent Application Publication No. 2018-38040, a band pass filter, which serves as a transmission filter, is connected between an input terminal and a common terminal. This band pass filter includes a plurality of series arm resonators and a plurality of parallel arm resonators. Further, in order to improve the out-of-band attenuation of the filter, a phase shift circuit is connected in parallel to the filter in between the input terminal and the common terminal. In Japanese Unexamined Patent Application Publication No. 2018-38040, the phase shift circuit includes, for example, four interdigital transducer electrodes. Of the four interdigital transducer electrodes, two interdigital transducer electrodes are connected to a node between the input terminal and the filter. Further, the remaining two interdigital transducer electrodes are connected to a node between the common terminal and the filter.

In Japanese Unexamined Patent Application Publication No. 2018-38040, two of the interdigital transducer electrodes of the phase shift circuit are connected to the same node between the input terminal and the filter. Further, the remaining two interdigital transducer electrodes are connected to the same node between the common terminal and the filter.

In the phase shift circuit such as the one described in Japanese Unexamined Patent Application Publication No. 2018-38040, the phase in the phase shift circuit is being inverted relative to the out-of-band phase of the filter. This improves the out-of-band attenuation.

However, with the configuration including the phase shift circuit described in Japanese Unexamined Patent Application Publication No. 2018-38040, in some cases, the attenuation on the high frequency side of a pass band of the filter is not sufficiently improved.

SUMMARY OF THE INVENTION

Preferred embodiments of the present invention provide filter devices that are each able to sufficiently increase out-of-passband attenuation.

A filter device according to a preferred embodiment of the present invention includes a filter circuit including a first terminal, a second terminal, and a plurality of series arm resonators located along a series arm connecting the first terminal and the second terminal, and an additional circuit connected in parallel to at least some of the plurality of series arm resonators on the series arm. The additional circuit includes at least three interdigital transducer electrodes including a first interdigital transducer electrode, a second interdigital transducer electrode, and a third interdigital transducer electrode, and the at least three interdigital transducer electrodes are provided along an acoustic wave propagation direction, and the first interdigital transducer electrode is connected to a first node that is one end portion of a series arm resonator having a lowest anti-resonant frequency of the plurality of series arm resonators, the second interdigital transducer electrode is connected to a second node whose potential is different from that of the first node, the third interdigital transducer electrode is connected to a third node whose potential is different from those of the first node and the second node, and the first node and the second node are closer to the first terminal than the third node.

According to preferred embodiments of the present invention, filter devices that are each able to sufficiently increase the out-of-passband attenuation are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

In the following, the present invention is disclosed in detail by describing preferred embodiments of the present invention with reference to the drawings.

Each preferred embodiment described in the present specification is for illustrative purposes only, and elements of different preferred embodiments may be partially exchanged or combined.

Figure 1:
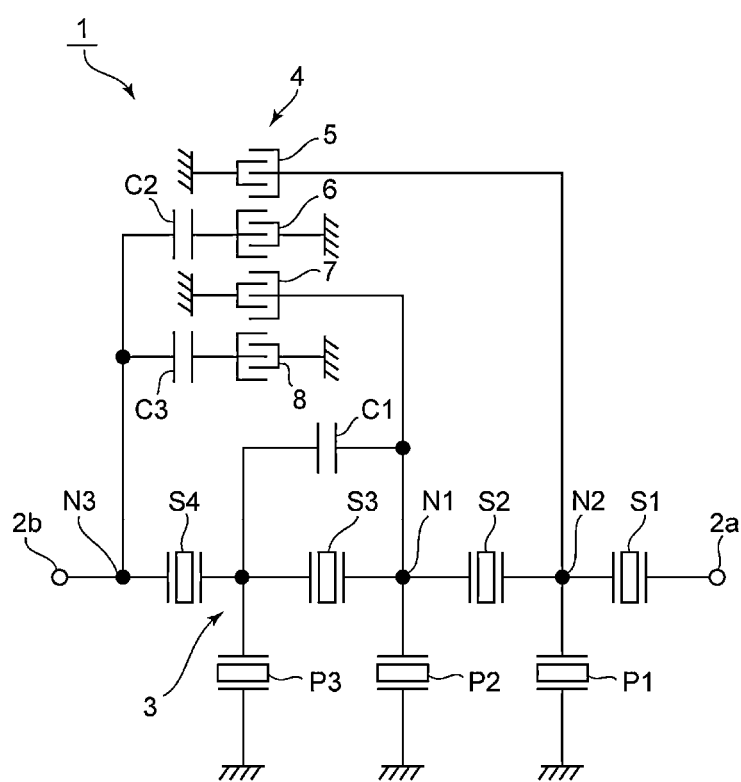
FIG. 1 is a circuit diagram of a filter device according to a first preferred embodiment of the present invention.

FIG. 1 is a circuit diagram of a filter device according to a first preferred embodiment of the present invention.

A filter device 1 includes an input terminal, which defines and functions as a first terminal 2a, and a second terminal 2b. Although not illustrated in FIG. 1, the second terminal 2b and one end portion of another band pass filter are connected together to define a multiplexer. The filter device 1 defines, for example, a transmission filter of Band 26. A pass band of the transmission filter of Band 26 is, for example, about 814 MHz to about 849 MHz. On the other hand, a pass band of a reception filter of Band 26 is, for example, about 859 MHz to about 894 MHz. Accordingly, it is preferable that the filter device 1 has a sufficiently large attenuation between about 859 MHz to 894 about MHz, for example.

A ladder band pass filter circuit 3 is connected between the first terminal 2a and the second terminal 2b. The filter circuit 3 includes a plurality of series arm resonators S1 to S4 and a plurality of parallel arm resonators P1 to P3. The series arm resonators S1 to S4 and the parallel arm resonators P1 to P3 each include a surface acoustic wave resonator. The structure of the surface acoustic wave resonator is not limited to a specific structure, but, for example, a surface acoustic wave resonator that uses a Y-cut LiNbO$_3$ substrate and utilizes Love waves is used.

Because of anti-resonant frequencies of the series arm resonators S1 to S4, attenuation poles are provided on the high frequency side of the pass band. The following Table 1 describes resonant frequencies and anti-resonant frequencies of the series arm resonators S1 to S4.

TABLE 1

| Series Arm Resonator | S1 | S2 | S3 | S4 |
|---|---|---|---|---|
| Resonant Frequency (MHz) | 838 | 832 | 839 | 831 |
| Anti-resonant Frequency (MHz) | 875 | 868 | 858 | 867 |

As is evident from the table 1, the anti-resonant frequency of the series arm resonator S3 is lower than the anti-resonant frequencies of the other series arm resonators S1, S2, and S4.

The following Table 2 describes resonant frequencies and anti-resonant frequencies of the parallel arm resonators P1 to P3.

TABLE 2

| Parallel Arm Resonator | P1 | P2 | P3 |
|---|---|---|---|
| Resonant Frequency (MHz) | 794 | 801 | 796 |
| Anti-resonant Frequency (MHz) | 830 | 836 | 833 |

As a bridging capacitor, a capacitor C1 is connected in parallel to the series arm resonator S3 having the lowest anti-resonant frequency. The anti-resonant frequency of the series arm resonator S3 described herein means an anti-resonant frequency after the capacitor C1 has been connected in parallel as the bridging capacitor.

In preferred embodiments of the present invention, in the case where a bridging capacitor is connected in parallel, as in the case described above, the anti-resonant frequency of the series arm resonator means the anti-resonant frequency after the bridging capacitor has been connected, and in the case where a bridging capacitor is not connected in parallel, the anti-resonant frequency of the series arm resonator means the anti-resonant frequency of the series arm resonator itself.

In the filter device 1, an additional circuit 4 is connected in parallel to the filter circuit 3 in between the first terminal 2a and the second terminal 2b. Specifically, the additional circuit 4 is connected in parallel to the series arm resonators S2 to S4 of the series arm resonators S1 to S4 included in the filter circuit 3. As described above, the case where the additional circuit 4 is connected in parallel to at least some of the series arm resonators included in the filter circuit 3 is also included in the case where "an additional circuit is connected in parallel to a filter circuit".

Figure 2:
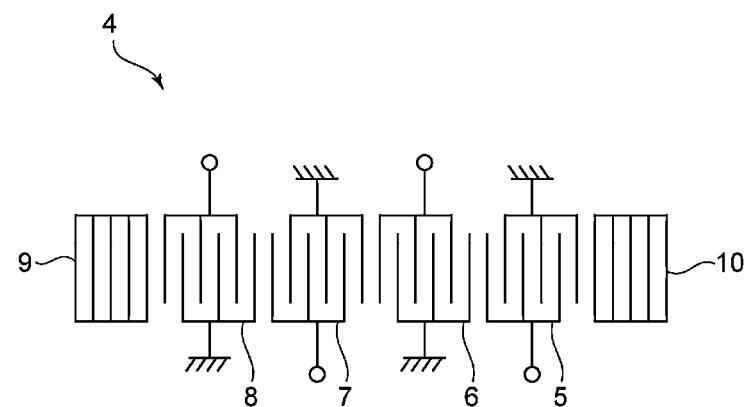
FIG. 2 is a plan view illustrating an electrode structure of an interdigital transducer electrode being included in the first preferred embodiment of the present invention.

The additional circuit 4 includes a plurality of interdigital transducer electrodes 5 to 8. The plurality of interdigital transducer electrodes 5 to 8 are arranged along an acoustic wave propagation direction. FIG. 2 illustrates the electrode structure of these interdigital transducer electrodes 5 to 8 in a plan view.

As is evident from FIG. 2, in practice, reflectors 9 and are provided on two sides of the plurality of interdigital transducer electrodes 5 to 8 in the acoustic wave propagation direction. This defines a longitudinally coupled resonator. In the present preferred embodiment, it is only necessary to arrange at least three of the interdigital transducer electrodes 5 to 8 along the acoustic wave propagation direction, and it is not necessary to provide the reflectors 9 and 10. Accordingly, not only the longitudinally coupled acoustic wave device, but also a transversal acoustic wave device may also be used.

Of the interdigital transducer electrodes 5 to 8, the interdigital transducer electrode 7 corresponds to a first interdigital transducer electrode, the interdigital transducer electrode 5 corresponds to a second interdigital transducer electrode, and the interdigital transducer electrodes 6 and 8 each correspond to a third interdigital transducer electrode.

One end portion of each of the interdigital transducer electrodes 5 to 8 is connected to a ground potential. The other end portion of each of the interdigital transducer electrodes 5 to 8 is connected to the filter circuit 3. More specifically, the other end portions of the interdigital transducer electrodes 5 and 7 are connected to nodes on the first terminal 2a side of the filter circuit 3. The interdigital transducer electrode 7 is connected to a first node N1. The interdigital transducer electrode 5 is connected to a second node N2. Here, the node on the first terminal 2a side of the filter circuit 3 means a node provided at a center or a position closer to the first terminal 2a than the center in the portion where the series arm resonators S1 to S4 are provided. Here, the second node N2 is different from the first node N1. That is to say, the first node N1 is positioned at the one end portion of the series arm resonator S3 having the lowest anti-resonant frequency. The second node N2 is the node between the series arm resonator S1 and the series arm resonator S2.

On the other hand, the one end portion of each of the interdigital transducer electrodes 6 and 8 is connected to the ground potential, and the other end portion of each of the interdigital transducer electrodes 6 and 8 is connected to a third node N3. The third node N3 is positioned on the second terminal 2b side and more specifically between the second terminal 2b and the series arm resonator S4. The interdigital transducer electrodes 6 and 8 are connected to the same third node N3 as described above.

The interdigital transducer electrodes 6 and 8 are connected to the third node N3 via capacitors C2 and C3, respectively.

The additional circuit 4 includes at least three interdigital transducer electrodes 5 to 8, the reflectors 9 and 10 which are not required, and the capacitors C2 and C3 which are not required. It is regarded that, by connecting this additional circuit 4 in parallel to the filter circuit 3, the filter device 1 can sufficiently increase the attenuation on the high frequency side of the pass band and more specifically, for example, sufficiently increase the attenuation in a frequency range of about 859 MHz to about 894 MHz. This is described more specifically in the following section.

The average electrode finger pitches of the interdigital transducer electrodes 5 to 8 are, for example, about 2.024 μm, about 1.976 μm, about 2.030 μm, and about 1.990 μm, respectively. The average electrode finger pitch is (the sum of electrode finger pitches of respective electrode fingers)/ (the number of electrode fingers) in the interdigital transducer electrode. The average electrode finger pitch of the interdigital transducer electrode 7 connected to the first node N1 is greater than the average electrode finger pitch of the interdigital transducer electrode 5 connected to the second node N2.

Figure 3:
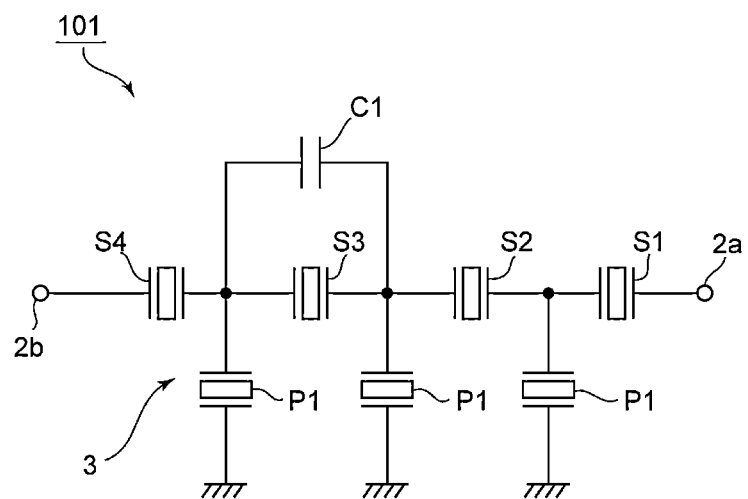
FIG. 3 is a circuit diagram of a filter device according to a comparative example 1.
Figure 4:
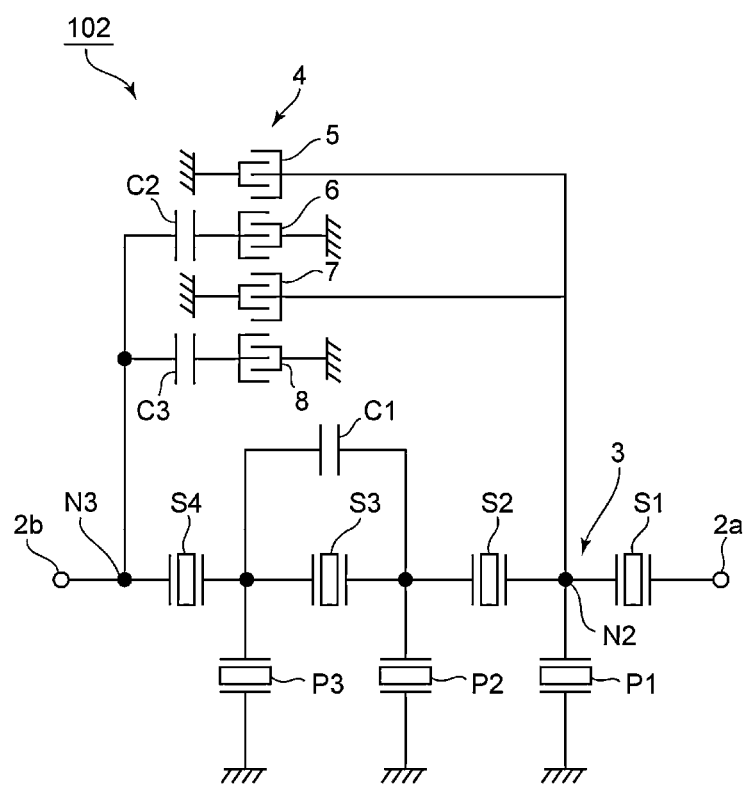
FIG. 4 is a circuit diagram of a filter device according to a comparative example 2.
Figure 5:
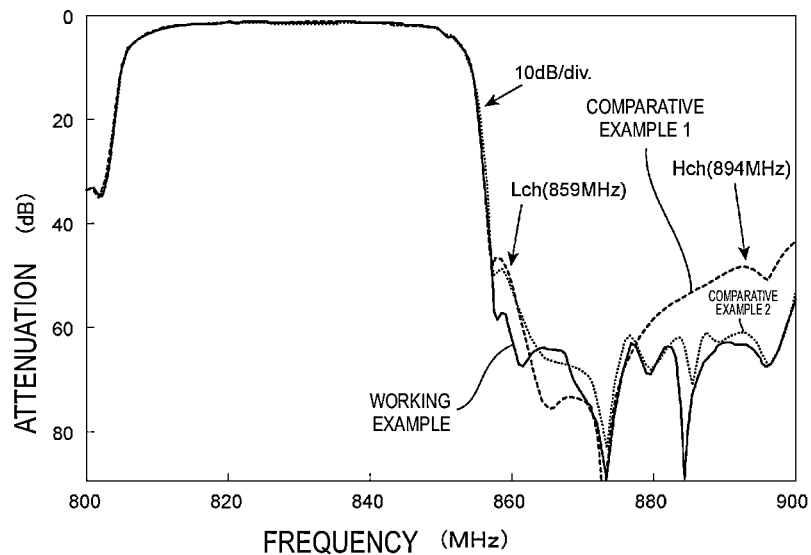
FIG. 5 is a diagram illustrating attenuation-frequency characteristics of a working example of a preferred embodiment of the present invention and the comparative examples 1 and 2.

The attenuation-frequency characteristic of the filter device 1 is illustrated by solid line in FIG. 5. For the purpose of comparison, the attenuation-frequency characteristic of a comparative example 1 is illustrated by thick dashed line, and the attenuation-frequency characteristic of a comparative example 2 is illustrated by thin dashed line. A circuit diagram of a filter device 101 of the comparative example 1 is illustrated in FIG. 3. Further, a circuit diagram of a filter device 102 of the comparative example 2 is illustrated in FIG. 4.

As is evident from FIG. 3, the filter device 101 does not include the additional circuit 4. On the other hand, the filter device 102 of the comparative example 2 includes the additional circuit 4, but both of the interdigital transducer electrodes 5 and 7 are connected to the second node N2. The remaining configurations of the filter devices 101 and 102 of the comparative example 1 and the comparative example 2 are the same or substantially the same as that of a working example of a preferred embodiment of the present invention.

As is evident from FIG. 5, the minimum attenuation in the pass band of the reception filter of Band 26 is about 47.9 dB in the comparative example 1 and about 49.8 dB in the comparative example 2. In contrast, the minimum attenuation in the pass band of the reception filter of Band 26 is about 57.9 dB in the working example. Accordingly, it was discovered that the working example enables an increase in the attenuation in the pass band of the reception filter of Band 26, that is to say, in an attenuation range on the high frequency side of the transmission filter of Band 26.

The loss in a range of about 814 MHz to about 849 MHz, which is the pass band of the transmission filter of Band 26, is about 2.08 dB in the comparative example 1 and about 2.27 dB in the comparative example 2. In contrast, the loss in a range of about 814 MHz to about 849 MHz is about 2.08 dB in the working example.

Accordingly, the foregoing preferred embodiment enables a sufficient increase in the attenuation in the pass band of the reception filter, which is out-of-passband. Moreover, in the working example, the loss in the range of about 814 MHz to about 849 MHz, which is the pass band, is not degraded compared with the comparative example 1 that does not include the additional circuit 4.

As illustrated in FIG. 5, in the comparative example 1, the attenuation decreases at around a low frequency side portion Lch=859 MHz and at around a high frequency side portion Hch=894 MHz of the pass band of the reception filter. It is considered that this degradation in the low frequency side portion Lch is caused because the capacitor C1 is connected in parallel with the series arm resonator S3. In the transmission filter of Band 26, the frequency gap between the pass band of the transmission filter and the pass band of the reception filter is narrow. Therefore, it is preferable that the transmission filter has a steeper filter characteristic on the high frequency side of the pass band. To increase the steepness on the high frequency side of the pass band, the anti-resonant frequency may be lowered by connecting the capacitor in parallel to the series arm resonator. However, when the attenuation at around the anti-resonant frequency increases, the attenuation on the high frequency side thereof decreases. That is to say, the attenuation rebounds considerably. Because of this, there is a problem of degradation of the attenuation at around the low frequency side portion Lch of the pass band of the reception filter.

In order to overcome degradation of the attenuation at around the low frequency side portion Lch such as the one described above, it is conceivable to connect a phase shift circuit such as the one described in Japanese Unexamined Patent Application Publication No. 2018-38040. However, it is difficult to invert the phase using the phase shift circuit because the phase changes greatly at around an attenuation pole provided by an anti-resonant frequency of a series arm resonator. In addition, it is difficult to ensure the inversion of phase across a wide range between the low frequency side portion Lch and the high frequency side portion Hch of the pass band of the reception filter. Therefore, in a phase shift circuit such as the one described in Japanese Unexamined Patent Application Publication No. 2018-38040, it is difficult to sufficiently reduce the attenuation in the entire or substantially the entire portion of the pass band of the reception filter.

Further, it is regarded that, compared with the comparative example 1 that does not include the additional circuit 4, the working example can sufficiently increase the attenuation both at around the low frequency side portion Lch and the high frequency side portion Hch of the pass band of the reception filter. First, it is regarded that the attenuation on the low frequency side portion Lch side of the pass band of the reception filter can be improved by connecting the interdigital transducer electrodes 5 and 7 of the additional circuit 4, which are to be connected to the input terminal side, to the first node N1 and the second node N2, which are different nodes. In addition, by relatively increasing the average electrode finger pitch of the interdigital transducer electrode 7 connected to the first node N1, the center frequency of a pass band provided in the path of the interdigital transducer electrode 7-4 the interdigital transducer electrode 8 in the additional circuit 4 becomes lower. Accordingly, because of the path going through the first node N1, the attenuation on the low frequency side portion Lch side of the pass band of the reception filter is further improved over a wide frequency range. On the other hand, by relatively decreasing the average electrode finger pitch of the interdigital transducer electrode 5 connected to the second node N2, the center frequency of a pass band provided in the path of the interdigital transducer electrode 5-4 the interdigital transducer electrode 6 becomes higher. Accordingly, because of the path going through the second node N2, it becomes possible to improve the attenuation on high frequency side portion Hch side of the pass band of the reception filter.

Accordingly, the working example enables a sufficient increase in the attenuation both at around the low frequency side portion Lch and at around the high frequency side portion Hch. Moreover, it becomes possible to sufficiently increase the attenuation in the entire or substantially the entire portion of the pass band of the reception filter.

In particular, in the foregoing preferred embodiment, the capacitor C1 is connected in parallel to the series arm resonator S3 having the lowest anti-resonant frequency. An advantageous effect of improving the attenuation in the entire portion of the pass band of the reception filter is further increased by connecting the interdigital transducer electrode 7 to the first node N1 which is one end portion of the series arm resonator S3. This is because the phase at around the anti-resonant frequency can be inverted effectively by directly connecting the additional circuit 4 to the series arm resonator S3 without using any other element.

As is evident from FIG. 5, in the comparative example 2, the same or substantially the same attenuation as that of the working example is obtained at around the high frequency side portion Hch of the pass band of the reception filter. However, in the comparative example 2, the attenuation at around the low frequency side portion Lch is hardly improved, compared with the comparative example 1 that does not include the additional circuit 4. It is considered that this is because the phase change is large in a rebound portion at around the low frequency side portion Lch, which is caused by the anti-resonant frequency of the series arm resonator S3, and the phase inversion is difficult in the additional circuit 4.

That is to say, because the interdigital transducer electrodes 5 and 7 are connected to the same second node N2, the path of the interdigital transducer electrode 7-4 the interdigital transducer electrode 8, which improves the attenuation at around the high frequency side portion Hch, and the path of the interdigital transducer electrode 5-4 the interdigital transducer electrode 6, which improves the attenuation at around the low frequency side portion Lch, interfere with each other. Therefore, it is difficult to divide the phase adjustment at around the low frequency side portion Lch and at around the high frequency side portion Hch.

In the case where the first terminal 2a is the input terminal, it is preferable to connect a plurality of the interdigital transducer electrodes 5 and 7, which are to be connected to the input terminal side, to the first node N1 and the second node N2, which are different nodes. Because of this, breakdown of the additional circuit 4 at the time of applying high power hardly occurs. Accordingly, it is preferable to connect at least one of the interdigital transducer electrode 5 and the interdigital transducer electrode 7 to a node that is not a node between the first terminal 2a and the series arm resonator S1. Of the plurality of series arm resonators S1 to S4, the series arm resonator S1 is the closest to the first terminal 2a.

Figure 6:
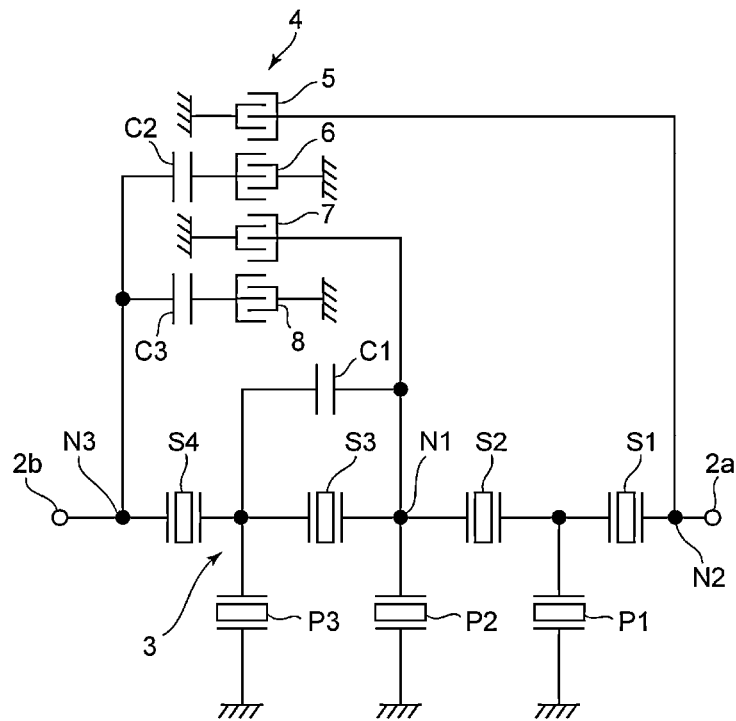
FIG. 6 is a circuit diagram of a filter device according to a second preferred embodiment of the present invention.

As illustrated in a second preferred embodiment of the present invention illustrated in FIG. 6, the interdigital transducer electrode 5 may alternatively be connected to a node between the first terminal 2a and the series arm resonator S1 which is the closest to the first terminal 2a. That is to say, at least one of the interdigital transducer electrode 7 and the interdigital transducer electrode 5 may be connected between the series arm resonator S1, which is the closest to the first terminal 2a, and the first terminal 2a.

Figure 7:
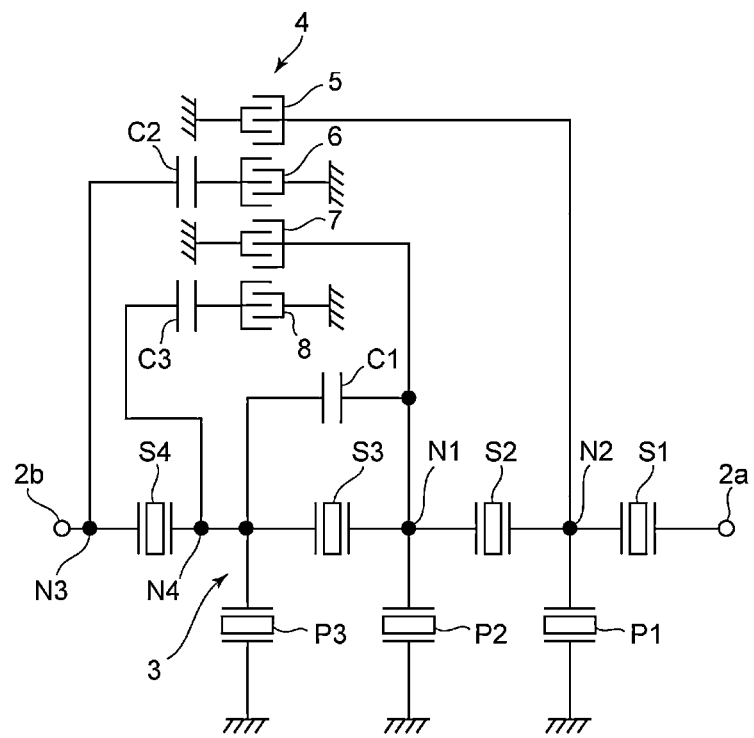
FIG. 7 is a circuit diagram of a filter device according to a third preferred embodiment of the present invention.

Further, as in a third preferred embodiment of the present invention illustrated in FIG. 7, the interdigital transducer electrodes 6 and 8, which are being connected to the filter circuit 3 on the second terminal 2b side, may be connected to different nodes, that is to say, the third node N3 and a fourth node N4. In this case, the interdigital transducer electrode 6 is the third interdigital transducer electrode, and the interdigital transducer electrode 8 is a fourth interdigital transducer electrode.

In FIG. 1, the additional circuit 4 includes the capacitors C2 and C3 to invert the phase and adjust the amplitude of a signal. The capacitors C2 and C3 do not necessarily need to be provided. Further, although the interdigital transducer electrodes 5 and 7 are directly connected to the filter circuit 3, a capacitive element may be connected between the interdigital transducer electrode 5 and the second node N2 and between the interdigital transducer electrode 7 and the first node N1. This enables compensation of the amplitude of a signal whose phase is to be inverted.

Further, instead of the capacitors C2 and C3 or the capacitive elements that may be connected to the interdigital transducer electrodes 5 and 7 sides as described above, a capacitance of the series arm resonator may alternatively be utilized.

In FIG. 1, the filter circuit 3 is a ladder filter including a plurality of acoustic wave resonators. However, the circuit configuration of the filter circuit 3 of the filter device 1 is not limited thereto. Various band pass filters each including a plurality of series arm resonators can be used as the filter circuit 3.

Further, the filter device 1 is not limited to the transmission filter but may alternatively be a reception filter or any other band pass filter. Accordingly, the first terminal 2a may alternatively be a reception terminal.

Moreover, in the foregoing preferred embodiments, the examples where the present invention is applied to the transmission filter of Band 26 are illustrated, and in these cases, as the high frequency side of the pass band, the attenuation in the pass band of the reception filter of Band 26 is improved. The portion where the attenuation in the pass band high frequency side is to be improved is not limited to the pass band of the reception filter of Band 26.

Further, the filter device 1 according to preferred embodiments of the present invention can be used as a duplexer, for example, by connecting the second terminal 2b and one end portion of the reception filter together. Moreover, the filter device 1 can be preferably used as one of band pass filters of a multiplexer in which three or more band pass filters are connected together at their respective end portions.

Further, in the foregoing preferred embodiments, the series arm resonators S1 to S4 and the parallel arm resonators P1 to P3 each include a surface acoustic wave resonator. Alternatively, the series arm resonators S1 to S4 and the parallel arm resonators P1 to P3 may each include a bulk wave resonator.

The filter devices of the foregoing preferred embodiments can be used as a duplexer of a radio frequency front-end circuit and the like. Such an example will be described in the following section.

Figure 8:
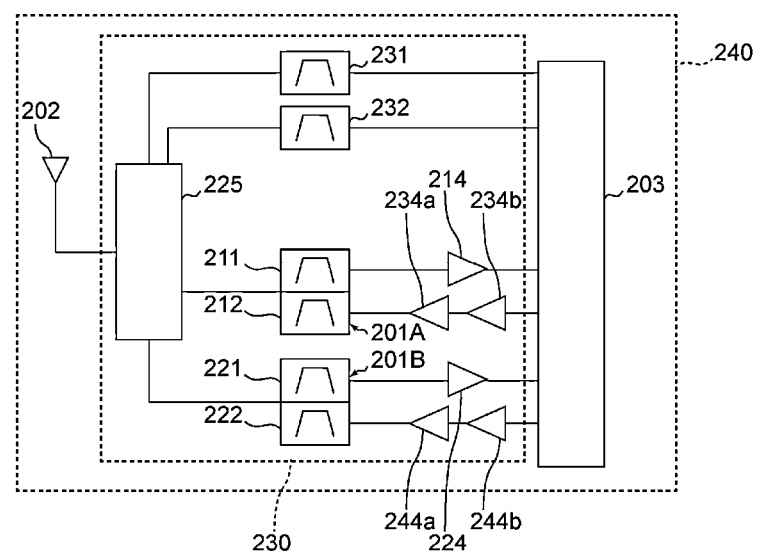
FIG. 8 is a configuration diagram of a communication device and a radio frequency front-end circuit according to preferred embodiments of the present invention.

FIG. 8 is a configuration diagram of a communication device and a radio frequency front-end circuit according to a preferred embodiment of the present invention. FIG. 8 also illustrates elements connected to a radio frequency front-end circuit 230, such as, for example, an antenna element 202 and a RF signal processing circuit (RFIC) 203. The radio frequency front-end circuit 230 and the RF signal processing circuit 203 define a communication device 240. The communication device 240 may also include, for example, a power source, a CPU, and a display.

The radio frequency front-end circuit 230 includes a switch 225, duplexers 201A and 201B, filters 231 and 232, low-noise amplifier circuits 214 and 224, and power amplifier circuits 234a, 234b, 244a, and 244b. The radio frequency front-end circuit 230 and the communication device 240 of FIG. 8 are examples of the radio frequency front-end circuit and the communication device, and the configurations of the radio frequency front-end circuit and the communication device are not limited these configurations.

The duplexer 201A includes filters 211 and 212. The duplexer 201B includes filters 221 and 222. The duplexers 201A and 201B are connected to the antenna element 202 via the switch 225. The filter device may be the filters 211 and 212 or may be the filters 221, 222, 231, and 232.

Moreover, preferred embodiments of the present invention are also applicable to a multiplexer including three or more filters such as, for example, a triplexer in which antenna terminals of three filters are connected to a common terminal, a hexaplexer in which antenna terminals of six filters are connected to a common terminal, or the like.

Further, the configuration of the multiplexer is not limited to the configuration in which both of the transmission filter and the reception filter are included and may alternatively have a configuration in which only the transmission filter or only the reception filter is included.

The switch 225 connects the antenna element 202 to a signal path corresponding to a predetermined band in accordance with a control signal from a controller (not illustrated) and includes, for example, a SPDT (Single Pole Double Throw) switch. The signal path to be connected to the antenna element 202 is not limited to one signal path, and a plurality of signal paths may alternatively be connected to the antenna terminal 202. That is to say, the radio frequency front-end circuit 230 may be compatible with carrier aggregation.

The low-noise amplifier circuit 214 is a reception amplifier circuit that amplifies a radio frequency signal (here, a radio frequency reception signal) that has been sent from the antenna element 202 via the switch 225 and the duplexer 201A and outputs to the RF signal processing circuit 203. The low-noise amplifier circuit 224 is a reception amplifier circuit that amplifies a radio frequency signal (here, a radio frequency reception signal) that has been sent from the antenna element 202 via the switch 225 and the duplexer 201B and outputs to the RF signal processing circuit 203.

The power amplifier circuits 234a and 234b are each a transmission amplifier circuit that amplifies a radio frequency signal (here, a radio frequency transmission signal) output from the RF signal processing circuit 203 and outputs to the antenna element 202 via the duplexer 201A and the switch 225. The power amplifier circuits 244a and 244b are each a transmission amplifier circuit that amplifies a radio frequency signal (here, a radio frequency transmission signal) output from the RF signal processing circuit 203 and outputs to the antenna element 202 via the duplexer 201B and the switch 225.

The RF signal processing circuit 203 performs signal processing on the radio frequency reception signal input from the antenna element 202 via a reception signal path using down-converting and the like, and outputs a reception signal generated by this signal processing. Further, the RF signal processing circuit 203 performs signal processing on an input transmission signal using up-converting and the like, and outputs a radio frequency transmission signal generated by this signal processing to the power amplifier circuits 234a, 234b, 244a, and 244b. The RF signal processing circuit 203 is, for example, a RFIC. Note that the communication device may include, for example, a BB (base band) IC. In this case, the BBIC performs signal processing on the reception signal processed in the RFIC. Further, the BBIC performs signal processing on the transmission signal and outputs to the RFIC. The reception signal processed in the BBIC and the transmission signal before the BBIC performs the signal processing are, for example, an image signal, an audio signal, and the like.

Instead of the duplexers 201A and 201B, the radio frequency front-end circuit 230 may alternatively include duplexers according to modified examples of the duplexers 201A and 201B.

On the other hand, the filters 231 and 232 of the communication device 240 are connected between the RF signal processing circuit 203 and the switch 225 without involving any one of the low-noise amplifier circuits 214 and 224 and the power amplifier circuits 234a, 234b, 244a, and 244b. As is the case with the duplexers 201A and 201B, the filters 231 and 232 are connected to the antenna element 202 via the switch 225.

The filter devices, the radio frequency front-end circuit, and the communication device according to preferred embodiments of the present invention have been described above. However, other preferred embodiments obtained by combining optional elements of the foregoing preferred embodiments, modified examples obtained by applying various modifications apparent to those skilled in the art to the foregoing preferred embodiments without departing the scope of the present invention, and various devices including a radio frequency front-end circuit or a communication device according to the present invention may also be included in the present invention.

Preferred embodiments of the present invention can be widely used in communication equipment such as, for example, cellular phones and the like as an acoustic wave resonator, a filter, a duplexer, a multiplexer applicable to a multiband system, a front-end circuit, and a communication device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
    a filter circuit including a first terminal, a second terminal, and a plurality of series arm resonators positioned along a series arm connecting the first terminal and the second terminal; and
    an additional circuit connected in parallel to at least some of the plurality of series arm resonators on the series arm; wherein
    the additional circuit includes at least three interdigital transducer electrodes including a first interdigital transducer electrode, a second interdigital transducer electrode, and a third interdigital transducer electrode, and the at least three interdigital transducer electrodes are positioned along an acoustic wave propagation direction; and
    the first interdigital transducer electrode is connected to a first node that is one end portion of a series arm resonator having a lowest anti-resonant frequency of the plurality of series arm resonators, the second interdigital transducer electrode is connected to a second node having a potential different from a potential of the first node, the third interdigital transducer electrode is connected to a third node having a potential different from the potentials of the first node and the second node, and the first node and the second node are closer to the first terminal than the third node.

2. The filter device according to claim 1, wherein an average electrode finger pitch of the first interdigital transducer electrode is greater than an average electrode finger pitch of the second interdigital transducer electrode.

3. The filter device according to claim 1, wherein the first terminal is an input terminal, and at least one of the first interdigital transducer electrode and the second interdigital transducer electrode is connected to a node that is not a node between the first terminal and a series arm resonator, the series arm resonator being one of the plurality of series arm resonators and being closest to the first terminal.

4. The filter device according to claim 1, wherein at least one of the first interdigital transducer electrode and the second interdigital transducer electrode is connected to a node between the first terminal and a series arm resonator of the plurality of series arm resonators closest to the first terminal.

5. The filter device according to claim 1, further comprising a capacitive element connected in parallel to the series arm resonator having a lowest anti-resonant frequency.

6. The filter device according to claim 1, wherein the at least three interdigital transducer electrodes further include a fourth interdigital transducer electrode, the fourth interdigital transducer electrode is connected to a fourth node having a potential different from the potential of the second node, the fourth node is positioned closer to the second terminal than the first node and the second node on the series arm, and the fourth node has a potential different from the potential of the third node.

7. The filter device according to claim 1, wherein the filter circuit further includes a plurality of parallel arm resonators.

8. A multiplexer comprising:
the filter device according to claim 1; and
another filter device including an end portion connected together with one end portion of the filter device.

9. A radio frequency front-end circuit comprising:
the multiplexer according to claim 8; and
an amplifier connected to the multiplexer.

10. A communication device comprising:
the radio frequency front-end circuit according to claim 9; and
a RF signal processing circuit connected to the radio frequency front-end circuit.

11. The multiplexer according to claim 8, wherein an average electrode finger pitch of the first interdigital transducer electrode is greater than an average electrode finger pitch of the second interdigital transducer electrode.

12. The multiplexer according to claim 8, wherein the first terminal is an input terminal, and at least one of the first interdigital transducer electrode and the second interdigital transducer electrode is connected to a node that is not a node between the first terminal and a series arm resonator, the series arm resonator being one of the plurality of series arm resonators and being closest to the first terminal.

13. The multiplexer according to claim 8, wherein at least one of the first interdigital transducer electrode and the second interdigital transducer electrode is connected to a node between the first terminal and a series arm resonator of the plurality of series arm resonators closest to the first terminal.

14. The multiplexer according to claim 8, further comprising a capacitive element connected in parallel to the series arm resonator having a lowest anti-resonant frequency.

15. The multiplexer according to claim 8, wherein the at least three interdigital transducer electrodes further include a fourth interdigital transducer electrode, the fourth interdigital transducer electrode is connected to a fourth node having a potential different from the potential of the second node, the fourth node is positioned closer to the second terminal than the first node and the second node on the series arm, and the fourth node has a potential different from the potential of the third node.

16. The multiplexer according to claim 8, wherein the filter circuit further includes a plurality of parallel arm resonators.

17. The radio frequency front-end circuit according to claim 9, wherein an average electrode finger pitch of the first interdigital transducer electrode is greater than an average electrode finger pitch of the second interdigital transducer electrode.

18. The radio frequency front-end circuit according to claim 9, wherein the first terminal is an input terminal, and at least one of the first interdigital transducer electrode and the second interdigital transducer electrode is connected to a node that is not a node between the first terminal and a series arm resonator, the series arm resonator being one of the plurality of series arm resonators and being closest to the first terminal.

19. The radio frequency front-end circuit according to claim 9, wherein at least one of the first interdigital transducer electrode and the second interdigital transducer electrode is connected to a node between the first terminal and a series arm resonator of the plurality of series arm resonators closest to the first terminal.

20. The radio frequency front-end circuit according to claim 9, further comprising a capacitive element connected in parallel to the series arm resonator having a lowest anti-resonant frequency.

* * * * *